US006936881B2

(12) United States Patent
Yeo et al.

(10) Patent No.: US 6,936,881 B2
(45) Date of Patent: Aug. 30, 2005

(54) CAPACITOR THAT INCLUDES HIGH PERMITTIVITY CAPACITOR DIELECTRIC

(75) Inventors: Yee-Chia Yeo, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 13 days.

(21) Appl. No.: 10/628,020

(22) Filed: Jul. 25, 2003

(65) Prior Publication Data

US 2005/0017286 A1 Jan. 27, 2005

(51) Int. Cl.$^7$ ............................................. H01L 27/108
(52) U.S. Cl. ..................... 257/310; 257/71; 257/296; 257/300; 257/508; 257/532; 257/905; 257/908
(58) Field of Search .................... 257/68, 71, 296–313, 257/508, 532, 905–908

(56) References Cited

U.S. PATENT DOCUMENTS

| | | | |
|---|---|---|---|
| 4,314,269 A | 2/1982 | Fujiki | |
| 4,631,803 A | 12/1986 | Hunter et al. | |
| 4,946,799 A | 8/1990 | Blake et al. | |
| 5,378,919 A | * 1/1995 | Ochiai | 257/204 |
| 5,447,884 A | 9/1995 | Fahey et al. | |
| 5,461,250 A | 10/1995 | Burghartz et al. | |
| 5,534,713 A | 7/1996 | Ismail et al. | |
| 5,629,544 A | 5/1997 | Voldman et al. | |
| 5,714,777 A | 2/1998 | Ismail et al. | |
| 5,763,315 A | 6/1998 | Benedict et al. | |
| 5,789,807 A | * 8/1998 | Correale, Jr. | 257/691 |
| 5,811,857 A | 9/1998 | Assaderaghi et al. | |
| 6,008,095 A | 12/1999 | Gardner et al. | |
| 6,015,993 A | 1/2000 | Voldman et al. | |
| 6,046,487 A | 4/2000 | Benedict et al. | |
| 6,059,895 A | 5/2000 | Chu et al. | |
| 6,222,234 B1 | 4/2001 | Imai | |
| 6,232,163 B1 | 5/2001 | Voldman et al. | |
| 6,258,664 B1 | 7/2001 | Reinberg | |
| 6,291,321 B1 | 9/2001 | Fitzgerald | |
| 6,294,834 B1 | 9/2001 | Yeh et al. | |
| 6,358,791 B1 | 3/2002 | Hsu et al. | |
| 6,387,739 B1 | 5/2002 | Smith, III | |

(Continued)

FOREIGN PATENT DOCUMENTS

WO    WO 03/017336 A2    2/2003

OTHER PUBLICATIONS

Ismail, K. et al., "Electron Transport Properties of Si/SiGe Heterostructures: Measurements and Device Implications," Applied Physics Letters, vol. 63, No. 5, (Aug. 2, 1993), pp. 660–662.

Nayak, D.K., et al., "Enhancement–Mode Quantum–Well $Ge_xSi_{f-x}$ PMOS," IEEE Electron Device Letters, vol. 12, No. 4, (Apr. 1991), pp. 154–156.

Gámiz, F., et al., "Strained–Si/SiGe–on–Insulator Inversion Layers: The Role of Strained–Si Layer Thickness on Electron Mobility," Applied Physics Letters, vol. 80, No. 22, (Jun. 3, 2002), pp. 4160–4162.

(Continued)

Primary Examiner—Andy Huynh
(74) Attorney, Agent, or Firm—Slater & Matsil, L.L.P.

(57) ABSTRACT

A decoupling capacitor is formed on a semiconductor substrate that includes a silicon surface layer. A substantially flat bottom electrode is formed in a portion of the semiconductor surface layer. A capacitor dielectric overlies the bottom electrode. The capacitor dielectric is formed from a high permittivity dielectric with a relative permittivity, preferably greater than about 5. The capacitor also includes a substantially flat top electrode that overlies the capacitor dielectric. In the preferred application, the top electrode is connected to a first reference voltage line and the bottom electrode is connected to a second reference voltage line.

90 Claims, 4 Drawing Sheets

U.S. PATENT DOCUMENTS

| | | | |
|---|---|---|---|
| 6,413,802 B1 | 7/2002 | Hu et al. | |
| 6,414,355 B1 | 7/2002 | An et al. | |
| 6,429,061 B1 | 8/2002 | Rim | |
| 6,448,114 B1 | 9/2002 | An et al. | |
| 6,475,838 B1 | 11/2002 | Bryant et al. | |
| 6,489,664 B2 | 12/2002 | Re et al. | |
| 6,518,610 B2 * | 2/2003 | Yang et al. | 257/295 |
| 6,524,905 B2 | 2/2003 | Yamamichi et al. | |
| 6,555,839 B2 | 4/2003 | Fitzgerald | |
| 6,558,998 B2 * | 5/2003 | Belleville et al. | 438/210 |
| 6,576,526 B2 * | 6/2003 | Kai et al. | 438/393 |
| 6,621,131 B2 | 9/2003 | Murthy et al. | |
| 6,653,700 B2 | 11/2003 | Chau et al. | |
| 6,794,764 B1 * | 9/2004 | Kamal et al. | 257/900 |
| 6,803,641 B2 * | 10/2004 | Papa Rao et al. | 257/532 |
| 2002/0076899 A1 | 6/2002 | Skotnicki et al. | |
| 2002/0153549 A1 | 10/2002 | Laibowitz et al. | |
| 2002/0190284 A1 | 12/2002 | Murthy et al. | |
| 2003/0000121 A1 | 1/2003 | Chau et al. | |
| 2003/0030091 A1 | 2/2003 | Bulsara et al. | |
| 2003/0080386 A1 | 5/2003 | Ker et al. | |
| 2004/0026765 A1 | 2/2004 | Currie et al. | |

OTHER PUBLICATIONS

Gámiz, F., et al., "Electron Transport in Strained Si Inversion Layers, Grown on SiGe–on–Insulator Substrates," Journal of Applied Physics, vol. 92, No. 1, (Jul. 1, 2002), pp. 288–295.

Mizuno, T., et al., "Novel SOI p–Channel MOSFETs With Higher Strain in Si Channel Using Double SiGe Heterostructures," IEEE Transactions on Electron Devices, vol. 49, No. 1, (Jan. 2002), pp. 7–14.

Tezuka, T., et al., "High–Performance Strained Si–on–Insulator MOSFETs by Novel Fabrication Processes Utilizing Ge–Condensation Technique," Symposium On VLSI Technology Digest of Technial Papers, (2002), pp. 96–97.

Jurczak, M., et al., "Silicon–on–Nothing (SON)—an Innovative Process for Advanced CMOS," IEEE Transactions on Electron Devices, vol. 47, No. 11, (Nov. 2000), pp. 2179–2187.

Jurczak, M., et al., "SON (Silicon on Nothing)—A New Device Architecture for the ULSI ERA," Symposium on VLSI Technology Digest of Technical Papers, (1999), pp. 29–30.

Maiti, C.K., et al., "Film Growth and Material Parameters," Application of Silicon–Germanium Heterostructure, Institute of Physics Publishing, Ch. 2 (2001) pp. 32–42.

Tiwari, S., et al., "Hole Mobility Improvement in Silicon–on–Insulator and Bulk Silicon Transistors Using Local Strain," International Electron Device Meeting, (1997), pp. 939–941.

Ootsuka, F., et al., "A Highly Dense, High–Performance 130nm Node CMOS Technology for Large Scale System–on–a–Chip Applications," International Electron Device Meeting, (2000), pp. 575–578.

Matthews, J.W., et al., "Defects in Epitaxial Multilayers—I. Misfit Dislocations," Journal of Crystal Growth, vol. 27, (1974), pp. 118–125.

Matthews, J.W., et al., "Defects in Epitaxial Multilayers—II. Dislocation Pile–Ups, Threading Dislocations, Slip Lines and Cracks," Journal of Crystal Growth, vol. 29, (1975), pp. 273–280.

Matthews, J.W., et al., "Defects in Epitaxial Multilayers—III. Preparation of Almost Perfect Multilayers," Journal of Crystal Growth, vol. 32, (1976), pp. 265–273.

Schüppen, A., et al., "Mesa and Planar SiGe–HBTs on MBE–Wafers," Journal of Materials Science: Materials in Electronics, vol. 6, (1995), pp. 298–305.

Matthews, J.W., "Defects Associated with the Accommodation of Misfit Between Crystals," J. Vac. Sci. Technol., vol. 12, No. 1 (Jan./Feb. 1975), pp. 126–133.

Huang, X., et al., "Sub–50 nm P–Channel FinFET," IEEE Transactions on Electron Devices, vol. 48, No. 5, May 2001, pp. 880–886.

Shahidi, G.G., "SOI Technology for the GHz Era," IBM J. Res. & Dev., vol. 46, No. 2/3, Mar./May 2002, pp. 121–131.

Shimizu, A., et al., "Local Mechanical Stress Control (LMC): A New Technique for CMOS–Performance Enhancement," IEDM 2001, pp. 433–436.

Wong, H.–S.P., "Beyond the Conventional Transistor," IBM J. Res. & Dev., vol. 46, No. 2/3, Mar./May 2002, pp. 133–167.

Yang, F.L., et al., "25 nm CMOS Omega FETs," IEDM 2002, pp. 255–258.

Yang, F.L., et al, "35nm CMOS FinFETs," 2002 Symposium on VLSI Technology Digest of Technical Papers, 2002, pp. 104–105.

Thompson, S., et al., "A 90 nm Logic Technology Featuring 50nm Strained Silicon Channel Transistors, 7 Layers of Cu Interconnects, Low k ILD, and 1um$^2$ SRAM Cell," IEDM, pp. 61–64.

Welser, J., et al., "NMOS and PMOS Transistors Fabricated in Strained Silicon/Relaxed Silicon–Germanium Structures," IEDM 1992, pp. 1000–1002.

Blaauw, D., et al.,"Gate Oxide and Subthreshold Leakage Characterization, Analysis and Optimization," date unknown.

"Future Gate Stack," International Sematech, 2001 Annual Report.

Chang, L., et al., "Reduction of Direct–Tunneling Gate Leakage Current in Double–Gate and Ultra–Thin Body MOSFETs," 2001 IEEE, Berkeley, CA.

Chang, L., et al., "Direct–Tunneling Gate Leakage Current in Double–Gat and Ultrathin Body MOSFETs," 2002 IEEE, vol. 49, No. 12, Dec. 2002.

Wang, L.K., et al., "On–Chip Decoupling Capacitor Design to Reduce Switching–Noise–Induced Instability in CMOS/SOI VLSI," Proceedings of the 1995 IEEE International SOI Conference, Oct. 1995, pp. 100–101.

Yeoh, J.C., et al., "MOS Gated Si:SiGe Quantum Wells Formed by Anodic Oxidation," Semicond. Sci. Technol. (1998), vol. 13, pp. 1442–1445, IOP Publishing Ltd., UK.

Cavassilas, N., et al., "Capacitance–Voltage Characteristics of Metal–Oxide–Strained Semiconductor Si/SiGe Heterostructures," Nanotech 2002, vol. 1, pp. 600–603.

* cited by examiner

CAPACITOR THAT INCLUDES HIGH PERMITTIVITY CAPACITOR DIELECTRIC

CROSS-REFERENCE TO RELATED APPLICATIONS

This application relates to the following co-pending and commonly assigned patent application: Ser. No. 10/627,218, filed concurrently herewith and entitled "Capacitor with Enhanced Performance and Method of Manufacture" (TSM03-0556), which application is hereby incorporated herein by reference.

TECHNICAL FIELD

The present invention relates generally to semiconductor devices and more particularly to a capacitor with enhanced performance and method of manufacture.

BACKGROUND

Power supply lines in a semiconductor integrated circuit chip supply current to charge and discharge active and passive devices in the integrated circuit. For example, digital complementary metal-oxide-semiconductor (CMOS) circuits draw current when the clock makes a transition. During the operation of circuits, the power supply lines must supply transient currents with a relatively high intensity, and can result in voltage noise on the power supply lines. The voltage on the power supply line will fluctuate when the fluctuation time of the transient current is short or when its parasitic inductance or parasitic resistance is large.

In state-of-the-art circuits, the operational frequency of the integrated circuit is in the order of several hundreds of mega-hertz (MHz) to several giga-hertz (GHz). In such circuits, the rising time of clock signals is very short, so that voltage fluctuations in the supply line can be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering or decoupling capacitors are usually used between the terminals of different power supply lines or between terminals of power supply line and the ground line. Decoupling capacitors act as charge reservoirs that additionally supply currents to circuits when required to prevent momentary drops in supply voltage.

FIG. 1 shows a circuit diagram containing these decoupling capacitors. Capacitor $C_1$ is a decoupling capacitor that is inserted between a power supply line $V_{DD}$ and the ground line GND. Most chips employ more than one power supply line, and may have a different power supply line $OV_{DD}$ for the output circuits that interface with external circuits. Capacitor $C_2$ is a decoupling capacitor that is inserted between the output voltage supply line $OV_{DD}$ and the ground line GND. Capacitor $C_3$ is a decoupling capacitor that is inserted between the supply line $V_{DD}$ and the output voltage supply line $OV_{DD}$. These decoupling capacitors are usually placed as close as possible to the transient current source or sink.

Decoupling capacitors are used in integrated chips employing both bulk and silicon-on-insulator substrates. However, the role of decoupling capacitors is more important in a silicon-on-insulator chip than in a bulk silicon chip due to the following reason. Integrated chips fabricated on bulk substrates can naturally decouple the power supply potential and the ground potential due to the presence of inherent depletion capacitances between the doped wells and the bulk substrate. Compared to bulk substrates, silicon-on-insulator chips have very low on-chip decoupling capacitance between the power supply lines and ground.

U.S. Pat. No. 6,558,998 entitled "SOI type integrated circuit with a decoupling capacity and process for embodiment of such a circuit" issued to Belleville et al. describes a decoupling capacitor that is formed with the formation of silicon-on-insulator substrates. While that capacitor may be formed with a large area or large capacitance, it is formed together with the substrate, which means that the substrate has to be customized for each different circuit design.

SUMMARY OF THE INVENTION

These and other problems are generally solved or circumvented, and technical advantages are generally achieved, by preferred embodiments of the present invention which teach an integrated circuit capacitor with improved capacitance density and method of manufacture a capacitor.

In accordance with a preferred embodiment of the present invention, a capacitor is formed in a capacitor includes an insulating layer overlying a substrate. A semiconductor layer overlies the insulator layer and a bottom electrode is formed in a portion of the semiconductor layer. A capacitor dielectric overlies the bottom electrode. Preferably, the capacitor dielectric comprising a high permittivity dielectric having a dielectric constant greater than about 5. A top electrode overlies the capacitor dielectric.

The preferred embodiment provides a decoupling capacitor that is formed on a semiconductor substrate that includes a silicon surface layer. A substantially flat bottom electrode is formed in a portion of the semiconductor surface layer. A capacitor dielectric overlies the bottom electrode and has a relative permittivity greater than about 5. A substantially flat top electrode overlies the capacitor dielectric. The top electrode is connected to a first reference voltage line and the bottom electrode is connected to a second reference voltage line.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiment this invention, a capacitor structure with a high permittivity dielectric is formed on a silicon-on-insulator substrate. The following discussion provides further details on the various embodiments and methods of manufacture.

The preferred embodiment of the present invention relates to a capacitor, and more specifically, to capacitors formed with improved capacitance density. As an example, these capacitors can be used as decoupling capacitors. A number of examples and methods of fabrication will be discussed below.

In the preferred embodiment of this invention, capacitors with improved capacitance density are taught. Such capacitors are useful as decoupling capacitors that help reduce voltage fluctuations in voltage supply lines in integrated circuit chips. The decoupling capacitors taught in this invention can be used on bulk substrates comprising an elemental semiconductor such as silicon, bulk substrates comprising of an alloy semiconductor such as silicon-germanium, or bulk substrates comprising of a compound semiconductor such as indium phosphide. More preferably, the decoupling capacitors may be formed on semiconductor-on-insulator substrates such as silicon-on-insulator substrates.

Figure 1:
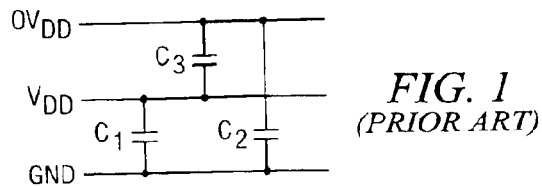
FIG. 1 shows an equivalent circuit of known decoupling capacitors.
Figure 2:
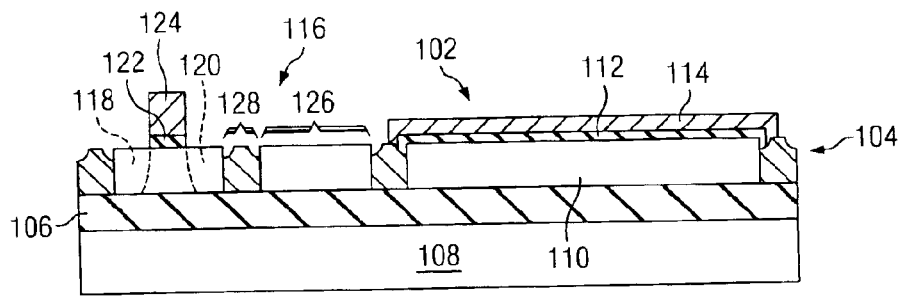
FIG. 2 provides a cross-sectional view of a preferred embodiment of this invention.

FIG. 2 provides a cross-sectional view of a preferred embodiment of this invention. In this embodiment, a decoupling capacitor 102 is formed on a semiconductor-on-insulator substrate that includes a semiconductor layer 104 on an insulator layer 106, which in turn overlies a substrate 108, preferably a silicon substrate. The capacitor 102 includes a bottom electrode 110, a capacitor dielectric 112 overlying the bottom electrode 110, and a top electrode 114 overlying the capacitor dielectric 112.

The bottom electrode 110 is preferably formed within the semiconductor layer 104. The bottom electrode 110 may be lightly-doped and electrically contacted by a highly-doped region (not shown in FIG. 2, see e.g., FIG. 4b). Alternatively, the bottom electrode 110 may be a highly-doped region. In various embodiments, the bottom electrode may be doped with n-type (e.g., arsenic or phosphorus) or p-type (e.g., boron) dopants.

The capacitor dielectric 112 is preferably a high permittivity (high-k) dielectric. By using a high-k dielectric as the capacitor dielectric 112, the capacitance density $$\frac{\varepsilon_0 \varepsilon_r}{t_{phys}}$$

is significantly higher than that of a capacitor employing a conventional silicon oxide dielectric, where $\varepsilon_0$ is the permittivity of free space, $\varepsilon_r$ is the relative permittivity, and $t_{phys}$ is the physical thickness of the capacitor dielectric. If the decoupling capacitor 102 maintains the same size (i.e., length×width of bottom and top electrodes 110 and 112), the use of a high-k capacitor dielectric improves the total capacitance and therefore reduces the voltage fluctuations in the voltage supply lines to which it decouples.

The high-k dielectric preferably has a relative permittivity of larger than 5, and more preferably has a relative permittivity of larger than 10, and even more preferably has a relative permittivity of larger than 20. The high permittivity dielectric may be selected from a group comprising of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), or combinations thereof. In the preferred embodiment, the high-k dielectric is hafnium oxide.

The silicon oxide equivalent thickness (EOT) of the capacitor dielectric 112 is preferably smaller than about 100 angstroms, more preferably smaller than about 50 angstroms, and even more preferably smaller than about 10 angstroms. The physical thickness of the capacitor dielectric may be smaller than about 100 angstroms, more preferably smaller than about 50 angstroms, and even more preferably smaller than about 10 angstroms. In other embodiments, the physical thickness of the capacitor dielectric may be smaller than about 100 angstroms, more preferably smaller than about 50 angstroms, and even more preferably smaller than about 10 angstroms.

The top electrode 114 is formed from a conductive material such as poly-crystalline silicon, poly-crystalline silicon-germanium, a metal, a metallic nitride, a metallic silicide, or a metallic oxide, or combinations thereof. Metals such as molybdenum, tungsten, titanium, tantalum, platinum, and hafnium may be used as the portion of the top electrode. Metallic nitrides may include, but will not be restricted to, molybdenum nitride, tungsten nitride, titanium nitride, tantalum nitride. Metallic silicides may include, but will not be restricted to, nickel silicide, cobalt silicide, tungsten silicide, titanium silicide, tantalum silicide, platinum silicide, erbium silicide. Metallic oxides may include, but will not be restricted to, ruthenium oxide and indium tin oxide.

As shown in FIG. 2, the decoupling capacitor may be formed in an active region in the vicinity of an active device such as a transistor 116. The transistor 116 includes source and drain regions 118 and 120 in silicon layer 104, a gate dielectric 122, and a gate electrode 124. In the preferred embodiment, the gate dielectric 122 is formed from the same layer as the capacitor dielectric 112 and the gate electrode 124 is formed from the same layer as the top electrode 114. In fact, as will be discussed below, the transistor 116 and capacitor 102 are preferably formed at the same time.

FIG. 2 also illustrates a third active region 126. While no device is shown in active region 126, it is understood that a capacitor, a transistor or another device such as a diode or a resistor can be formed. In fact a typical semiconductor chip will include many different device components formed. In some cases, a number of devices will be formed in a single active region while in other cases a single active region will include only one element.

Active region 126 is isolated from the active region that includes capacitor 102 and the active region that includes transistor 116 by isolation regions 128. In the illustrated embodiment, shallow trench isolation (STI) is used. In this case, an insulator, such as silicon oxide, is formed within a trench between active areas. In the preferred embodiment, the STI dielectric fill material is chemical vapor deposited silicon oxide. The shallow trench isolation structure may also comprise trench liner oxide (not shown for simplicity) on the boundaries of the trench. The trench liner oxide may or may not contain nitrogen. In other embodiments, other isolation techniques such as mesa isolation can be used. In those cases, the trenches are left unfilled during formation of the devices in the active regions.

Figure 3:
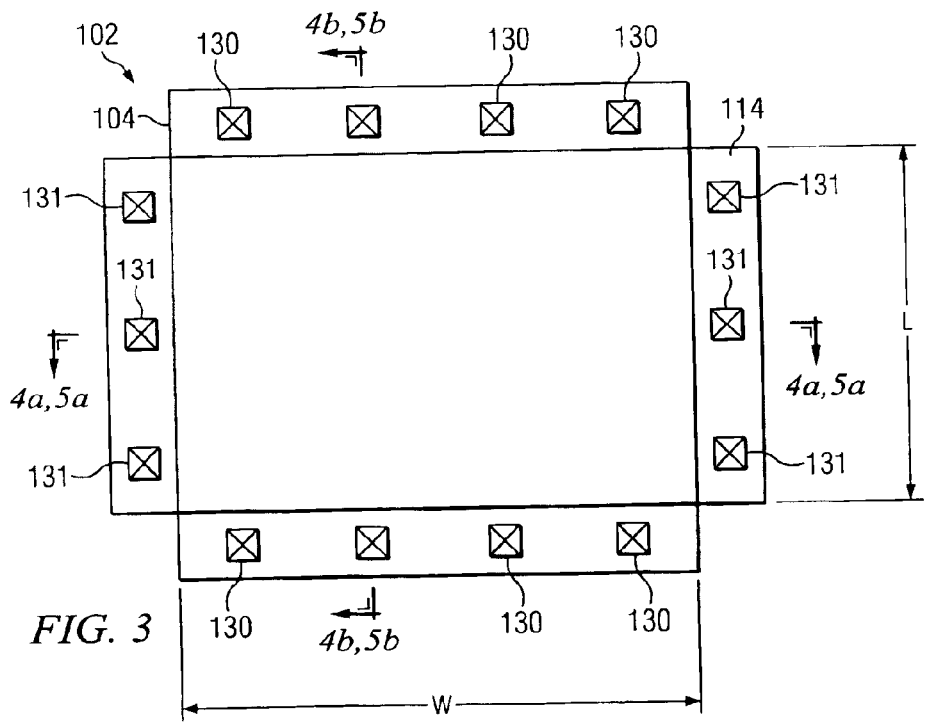
FIG. 3 is a top view or layout view of a capacitor of the preferred embodiment.
Figure 4A:
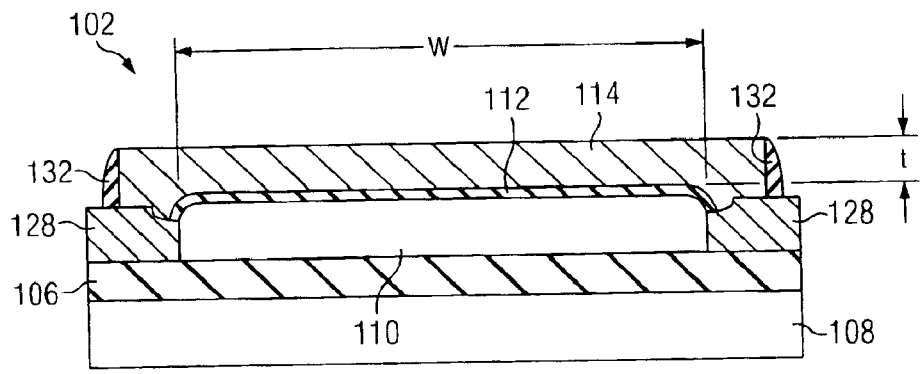
FIGS. 4a and 4b show cross-sectional views of a capacitor of a preferred embodiment.
Figure 4B:
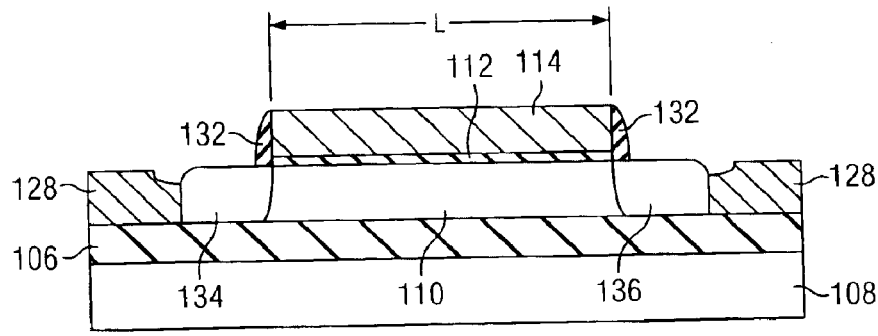

FIG. 3 is a top view or layout view of the capacitor 102 of the preferred embodiment. The capacitor 102 has a width W and a length L. In the preferred embodiment, the width W may have a dimension of greater than about 5 microns, and preferably greater than about 10 microns. In the preferred embodiment, the length L may have a dimension of greater than about 1 micron, and preferably greater than about 5 microns. The detailed structure of the capacitor may be seen in cross-sectional views along the lines A–A' and B-B', which are shown in FIGS. 4a and 4b. The contacts 130 are shown in the cross-sectional views of FIGS. 5a and 5b, for example.

The cross-sectional view along line A–A' is shown in FIG. 4a. The top electrode 114 extends laterally over the isolation regions 128. The top electrode in FIG. 4a is shown to have a thickness t, preferably in the range of about 200 angstroms to about 2000 angstroms. The capacitor structure 102 may additionally have spacers 132 formed on the sides of the top electrode 114. In a typical embodiment, these spacers 132 are formed during formation of transistor 116 (FIG. 2) and therefore also included with the capacitor 102. The spacers 132, however, are optional.

The cross-sectional view along line B–B' is shown in FIG. 4b. FIG. 4b shows that the bottom electrode 110 can be electrically connected via adjacent doped regions 134 and 136. One or more doped regions 134 (136) can be included. In the case where the bottom electrode 110 is not heavily doped, the bottom electrode 110 may include an inversion layer. An inversion layer may be formed by a supply of mobile carriers from the adjacent doped regions, and when there is a substantial bias between the top and bottom electrodes 110 and 114. The substantial bias can be the potential between $V_{DD}$ and GND, between $OV_{DD}$ and GND, or between $OV_{DD}$ and $V_{DD}$.

In one embodiment, the bottom electrode 110 is doped to the same conductivity type as the contact regions 134 and 136. That is, the impurities added to the silicon layer 104 are the same conductivity type (n or p) for bottom electrode 110 and contact regions 134 and 136.

In another embodiment, the bottom electrode 110 is doped to a different conductivity type. In this case, the inversion region creates the contact between regions 110, 134 and 136. For example, in one embodiment the contact regions 134 and 136 are physically doped with n-type dopants (e.g., arsenic and/or phosphorus) and the electrode region 110 is physically doped with p-type dopants (e.g., boron). When the top electrode 114 is connected to a high enough voltage level, an inversion region will be formed in bottom electrode 110, which will appear to be n-doped. In this manner, the bottom electrode contact regions 134 and/or 136 are doped to a given conductivity type (n-type in this example) and the bottom electrode 110 is operationally doped the given conductivity type. In this context, "operationally doped" means being at that doping level whenever the chip is operational. This definition excludes a transistor, which is at that doping level only when that transistor itself, rather than the chip, is turned on.

Figure 5A:
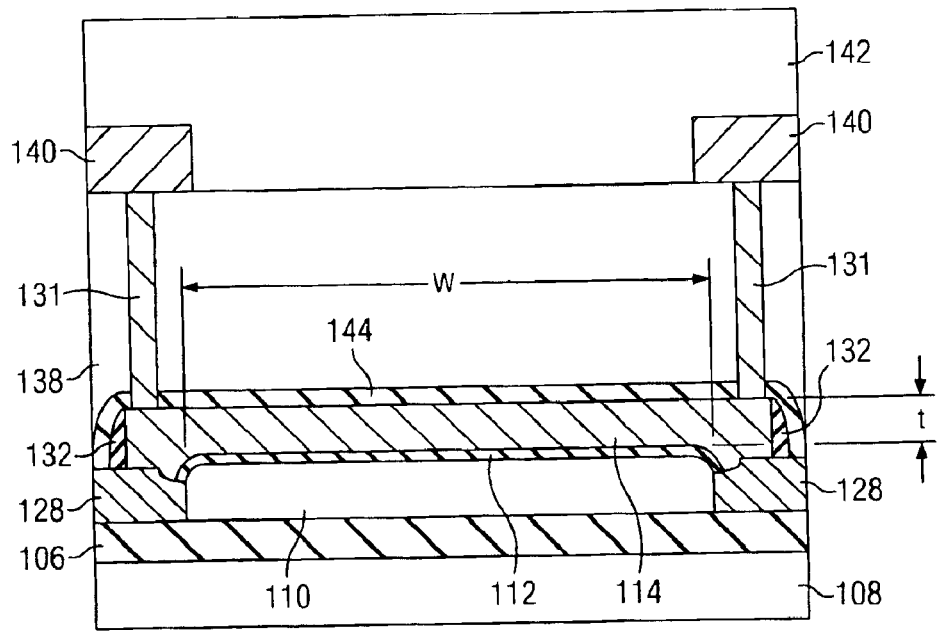
FIGS. 5a and 5b show other cross-sectional views of a capacitor of a preferred embodiment.
Figure 5B:
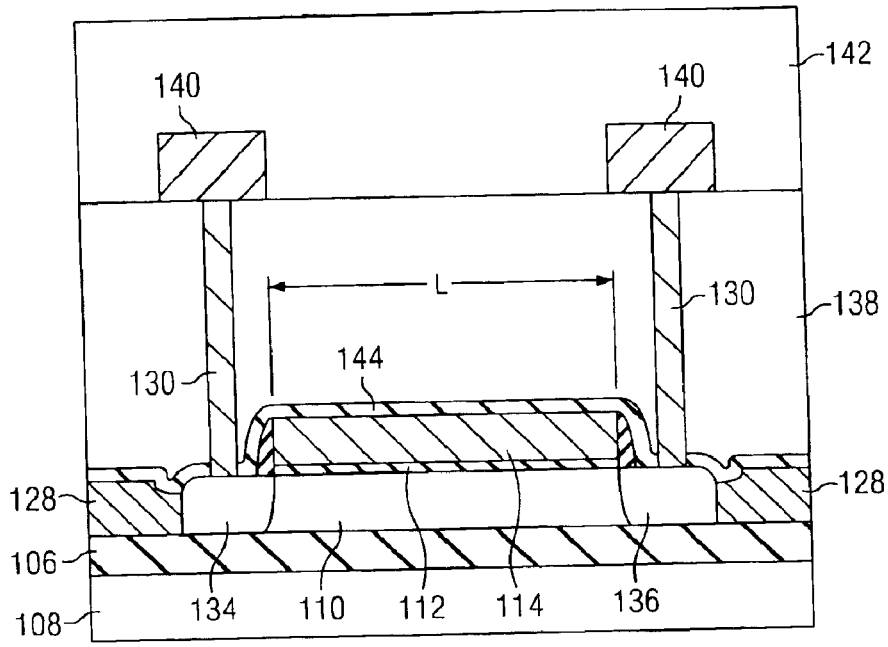

An embodiment showing the contacts 130 and 131 to the bottom and top electrodes 110 and 114 is shown in FIGS. 5a and 5b (collectively FIG. 5). FIG. 5a shows a cross-sectional view along line A–A' of FIG. 3 and FIG. 5b shows a cross-sectional view along line B–B' of FIG. 3.

The views of FIG. 5 include an inter-layer dielectric 138. The inter-layer dielectric (ILD) 138 can be a chemical vapor deposited dielectric such as silicon oxide. The ILD 138 can also be a low permittivity (low-k) dielectric employed in interconnect technology. By using a low-k ILD to cover the capacitor 102, parasitic capacitances between the top electrode 114 and metal lines 140 in the vicinity of the top electrode 114 can be reduced.

In the preferred embodiment, the relative-permittivity of the low-k dielectric 138 is less than about 3.5, and more preferably less than about 3.0. For example, the low-k dielectric material can be an organic material, such as benzocyclobutene (BCB), SILK, FLARE, or others. Alternatively, the low-k dielectric material can be an inorganic dielectric material, such as methyl silsesquioxane (MSQ), hydrogen silsesquioxane (HSQ), SiOF, for example. These materials are exemplary only as other embodiments may include different low-k dielectric materials.

A contact etch-stop layer 144 can overlie the top electrode 114 and the spacer 132, as shown in FIG. 5. The contact etch-stop layer 144 is preferably silicon nitride, but it is understood that other materials with a different etch rate from the ILD 138 can be used. The silicon nitride etch-stop layer 144 can have an inherent stress in the range of −2 giga-pascals (GPa) to +2 GPa, where negative stress implies compressive stress and positive stress implies tensile stress.

A contact plug 131 electrically couples the top electrode 114 to interconnect metal lines 140 as shown in FIG. 5a. As shown in FIG. 5b, a contact plug 130 electrically couples the doped region 134 (135) in the semiconductor layer 104 with the bottom electrode 110. The contact plugs are made of a conductive material such as tungsten and may include barrier layers (not shown), e.g., titanium and titanium nitride.

A inter-metal dielectric (IMD) 142 is formed over metal layer 140 and ILD 138. The IMD 142 can be formed from any of the materials listed above. The IMD 142 can be the same material or a different material than ILD 138. While not shown, contacts can be formed through the IMD 142 to contact metal layer 140.

It is understood that the capacitor 102 can be used in a semiconductor-on-insulator technology employing trench isolation, or may be used in a semiconductor-on-insulator technology employing mesa isolation. In mesa isolation, trenches are not filled with a dielectric filling material prior to the formation of transistors or capacitors. In a semiconductor chip employing mesa isolation, trenches between active regions are not filled with dielectric prior to the formation of active devices.

Next, a method of manufacturing a capacitor will be described with respect to FIGS. 6a–6f. As will be discussed, the capacitor can be formed at the same time as a transistor (see e.g., transistor 116 in FIG. 2).

Figure 6A:
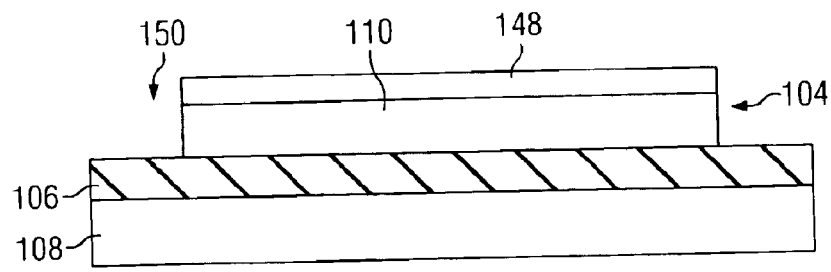
FIGS. 6a–6f show cross-sectional views of a capacitor of the preferred embodiment during various stages of the fabrication process.

Referring now to FIG. 6a, a semiconductor-on-insulator substrate including substrate 108, insulator 106 and semiconductor layer 104 is provided. An active region mask 148 is used to define trenches 150 in the semiconductor layer 104. The semiconductor layer 104 preferably has a thickness of about 1000 angstroms or thinner. The insulator 106 thickness is preferably about 1200 angstroms or thinner. The mask 148 preferably comprises silicon nitride, and more preferably comprises silicon nitride on a silicon oxide layer.

Figure 6B:
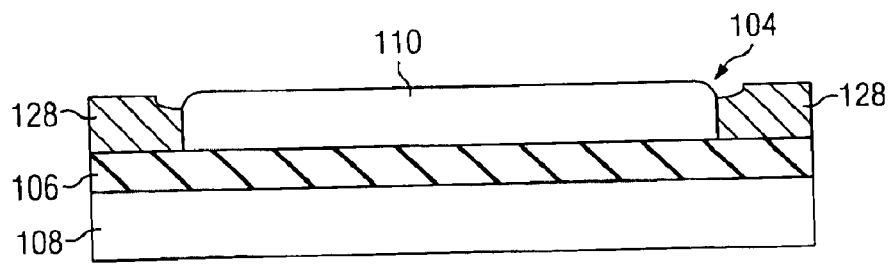

Trench filling dielectric material is deposited by chemical vapor deposition to fill the trenches 150, followed by a chemical mechanical planarization process step. The mask 148 is then removed to give the cross-section as shown in FIG. 6b. The bottom electrode 110 may or may not be heavily doped at this point. If an ion implantation step with a high dose is introduced into the active region at this point to dope the semiconductor layer 104, a heavily-doped bottom electrode 110 can be formed. For example, the heavily-doped active region or bottom electrode 110 may have a doping concentration of greater than about $10^{19} cm^{-3}$.

Figure 6C:
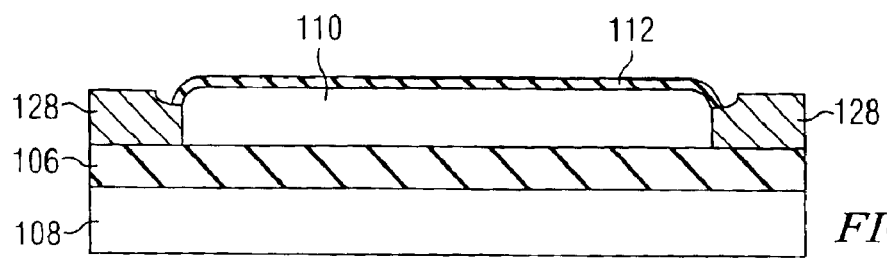

The capacitor dielectric 112 is then formed, as shown in FIG. 6c. The physical thickness of the dielectric 112 may be larger than 5 angstroms, more preferably larger than 20 angstroms, and even more preferably larger than 40 angstroms. The capacitor dielectric 112 may be formed together with the formation of a transistor gate dielectric in a different portion of the semiconductor chip (not shown here, see FIG. 2). By forming the high-k capacitor dielectric together with the gate dielectric of a transistor in a different portion of the chip, no additional process steps are introduced.

High-k dielectric materials as previously described may be used. The high-k dielectric may be formed by chemical vapor deposition, sputter deposition, or other known techniques of forming high-k dielectric materials. An interfacial layer (not shown) can be formed on the bottom electrode 110 prior to the formation of the high-k dielectric material 112. The interfacial layer may be a silicon oxide layer or a silicon oxynitride layer. The active region may additionally be treated in a hydrogen-containing or nitrogen-containing ambient prior to the formation of the interfacial layer.

The top electrode 114 material can then be deposited over the capacitor dielectric layer 112. The top electrode material can be comprised of conventional poly-crystalline silicon, poly-crystalline silicon germanium, metals, metallic silicides, or metallic nitrides, as previously described. The top electrode material may be deposited by conventional techniques such as chemical vapor deposition. The top electrode may also be formed by the deposition of silicon and metal, followed by an anneal to form a metal silicide gate electrode material. The top electrode material is then patterned using photolithography techniques, and etched using plasma etch processes to form the gate electrodes.

Figure 6D:
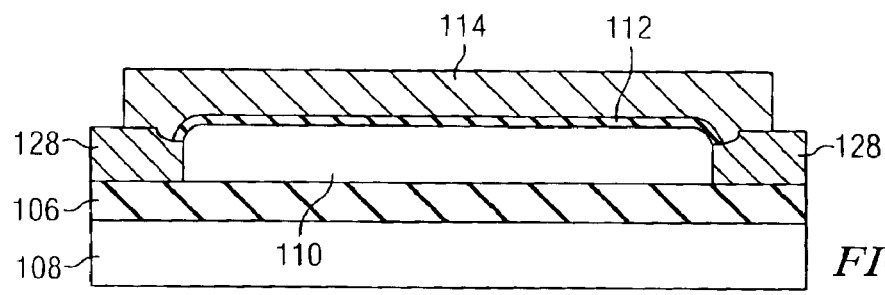

The deposition of the top electrode 114 material may be the same process step as the deposition of gate electrode material of a transistor to be formed in a different portion of the semiconductor chip, and the etching of the top electrode may similarly be accomplished together with the etching of the gate electrode of the transistor. The completed top electrode 114 is shown in FIG. 6d. The capacitor dielectric 112 is retained at least in the portion of the capacitor covered by the top electrode 114.

Doping may be introduced in regions adjacent to the bottom electrode to make electrical contacts with the bottom electrode 110. The electrical contact regions 134 and 136 are shown in the cross-sectional views of FIG. 4b and FIG. 5b (and are above and below the plane of the page in the view of FIG. 6d. The doping of contact regions 134 and 136 is formed at the same time that source and drain regions of the transistor (116 in FIG. 2) are doped. For example, the doping step performed in FIG. 6d can form the lightly doped extensions of the source and drain.

Figure 6E:
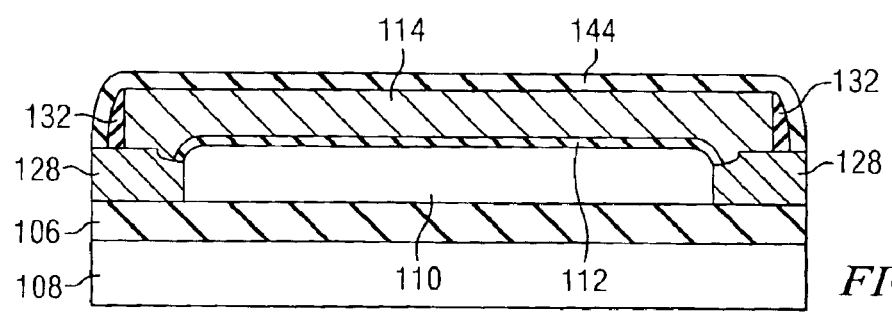
Figure 6F:
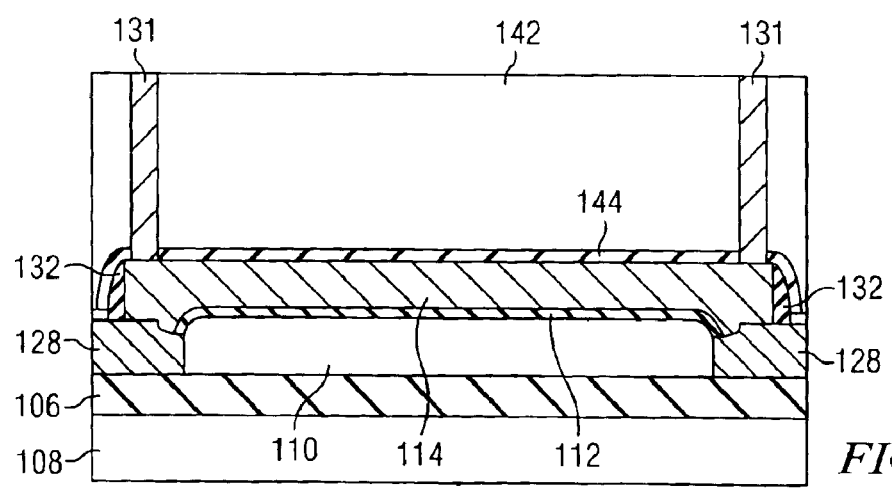

As shown in FIG. 6e, spacers 132 may be additionally formed on the sides of the top electrode 114. This may be followed by another implant to doped the regions (134 and 136 in FIG. 4b) of the active region not covered by the top electrode 114 and spacers 132. This step will simultaneously form the heavily doped source and drain regions of transistors on the chip.

A contact etch-stop layer 144 can be formed on the top electrode 114 and spacers 132. An inter-layer dielectric (ILD) 142 can be formed over the capacitor and contact holes 131 (and 130 in FIG. 5b) can be etched through the ILD 142 to reach the top and bottom electrodes 110 and 114. Conductive materials, such as tungsten, are then used to fill the contact holes to electrically contact the top and bottom electrodes to metal layers (see e.g., metal layer 140 in FIG. 5b).

Although the capacitor described in this invention has been illustrated for use as a decoupling capacitance, it is understood that the capacitor thus formed according to this invention may be used for other purposes. For example, the capacitor may be used as a coupling capacitor.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit including a capacitor, the integrated circuit comprising:
    an insulating layer overlying a substrate;
    a semiconductor layer overlying the insulator layer;
    a bottom electrode formed in a first portion of the semiconductor layer;
    a channel region formed in a second portion of the semiconductor layer, the channel region being disposed between a source region and a drain region;
    a capacitor dielectric overlying the bottom electrode, the capacitor dielectric comprising a high permittivity dielectric having a dielectric constant greater than about 5;
    a gate dielectric overlying the channel region;
    a top electrode overlying the capacitor dielectric; and
    a gate electrode overlying the gate dielectric.

2. The integrated circuit of claim 1 wherein the capacitor is a decoupling capacitor.

3. The integrated circuit of claim 2 wherein the top electrode is connected to a power supply line and the bottom electrode is connected to a ground line.

4. The integrated circuit of claim 1 wherein the top electrode is connected to a first power supply line and the bottom electrode is connected to a second power supply line.

5. The integrated circuit of claim 1 wherein the bottom electrode or the top electrode is substantially flat.

6. The integrated circuit of claim 1 wherein the top electrode comprises poly-crystalline silicon.

7. The integrated circuit of claim 1 wherein the top electrode comprises a metal selected from the group consisting of molybdenum, tungsten, titanium, tantalum, platinum, and hafnium.

8. The integrated circuit of claim 1 wherein the top electrode comprises a metal nitride selected from the group consisting of molybdenum nitride, tungsten nitride, titanium nitride, tantalum nitride, and combinations thereof.

9. The integrated circuit of claim 1 wherein the top electrode comprises a metal silicide selected from the group consisting of nickel silicide, cobalt silicide, tungsten silicide, titanium silicide, tantalum silicide, platinum silicide, erbium silicide, and combinations thereof.

10. The integrated circuit of claim 1 wherein the top electrode comprises a metal oxide selected from the group consisting of ruthenium oxide, indium tin oxide, and combinations thereof.

11. The integrated circuit of claim 1 wherein the high permittivity dielectric comprises hafnium oxide.

12. The integrated circuit of claim 1 wherein the high permittivity dielectric comprises a material selected from the group consisting of aluminum oxide, hafnium oxynitride, hafnium silicate, zirconium oxide, zirconium oxynitride, zirconium silicate, and combinations thereof.

13. The integrated circuit of claim 1 wherein the high permittivity dielectric has a relative permittivity of greater than about 10.

14. The integrated circuit of claim 1 wherein the high permittivity dielectric has a relative permittivity of greater than about 20.

15. The integrated circuit of claim 1 wherein the capacitor dielectric has a physical thickness of less than about 100 angstroms.

16. The integrated circuit of claim 1 wherein the capacitor dielectric has a physical thickness of less than about 20 angstroms.

17. The integrated circuit of claim 1 wherein the capacitor has a width of larger than about 5 microns.

18. The integrated circuit of claim 1 wherein the capacitor has a width of larger than about 10 microns.

19. The integrated circuit of claim 1 wherein the capacitor has a length of larger than about 1 micron.

20. The integrated circuit of claim 1 wherein the capacitor has a length of larger than about 5 microns.

21. The integrated circuit of claim 1, further comprising at least one bottom electrode contact region electrically coupled to the bottom electrode, wherein the bottom electrode contact region is doped to a first conductivity type and wherein the bottom electrode is doped to a second conductivity type and wherein a supply voltage is coupled to the integrated circuit so as to create an inversion region of the first conductivity type in the bottom electrode.

22. The integrated circuit of claim 1, further comprising at least one bottom electrode contact region electrically coupled to the bottom electrode, wherein the bottom electrode and the bottom electrode contact region are doped to a first conductivity type.

23. The integrated circuit of claim 1 wherein the gate dielectric is formed from the same material as the capacitor dielectric.

24. The integrated circuit of claim 23 wherein the high permittivity dielectric comprises hafnium oxide.

25. The integrated circuit of claim 23 wherein the high permittivity dielectric comprises a material selected from the group consisting of hafnium oxynitride, hafnium silicate, zirconium oxide, zirconium oxynitride, zirconium silicate, and combinations thereof.

26. The integrated circuit of claim 1 wherein the gate electrode is formed from the same layer as the top electrode.

27. A decoupling capacitor comprising:
a semiconductor substrate comprising a silicon surface layer;
a substantially flat bottom electrode formed in a portion of the silicon surface layer, wherein the bottom electrode is doped to a first conductivity type;
a doped region formed within the silicon surface layer adjacent to the bottom electrode, the doped region doped to a second conductivity type;
a capacitor dielectric overlying the bottom electrode, the capacitor dielectric comprising a high permittivity dietetic with a relative permittivity greater than about 5; and
a substantially flat top electrode overlying the capacitor dielectric,
wherein the top electrode is electrically coupled to a first reference voltage line and the bottom electrode is electrically coupled to a second reference voltage line.

28. The decoupling capacitor of claim 27 wherein the top electrode is connected to a power supply line and the bottom electrode is connected to a ground line.

29. The decoupling capacitor of claim 27 wherein the top electrode is connected to a first power supply line and the bottom electrode is connected to a second power supply line.

30. The decoupling capacitor of claim 27 wherein the semiconductor substrate is a bulk silicon substrate.

31. The decoupling capacitor of claim 27 wherein the semiconductor substrate is a silicon-on-insulator substrate.

32. The decoupling capacitor of claim 27 wherein the top electrode comprises silicon.

33. The decoupling capacitor of claim 27 wherein the top electrode comprises a metal selected from the group consisting of molybdenum, tungsten, titanium, tantalum, platinum, and hafnium.

34. The decoupling capacitor of claim 27 wherein the top electrode comprises a metal nitride selected from the group consisting of molybdenum nitride, tungsten nitride, titanium nitride, tantalum nitride, and combinations thereof.

35. The decoupling capacitor of claim 27 wherein the top electrode comprises a metal silicide selected from the group consisting of nickel silicide, cobalt silicide, tungsten silicide, titanium silicide, tantalum silicide, platinum silicide, erbium silicide, or combinations thereof.

36. The decoupling capacitor of claim 27 wherein the high permittivity dielectric comprises hafnium oxide.

37. The decoupling capacitor of claim 27 wherein the high permittivity dielectric comprises a material selected from the group consisting of hafnium oxynitride, hafnium silicate, zirconium oxide, zirconium oxynitride, zirconium silicate, and combinations thereof.

38. The decoupling capacitor of claim 27 wherein the high permittivity dielectric has a relative permittivity of greater than 10.

39. The decoupling capacitor of claim 27 wherein the high permittivity dielectric has a relative permittivity of greater than 20.

40. The decoupling capacitor of claim 27 wherein the capacitor dielectric has a physical thickness of less than about 100 angstroms.

41. The decoupling capacitor of claim 27 wherein the capacitor dielectric has a physical thickness of less than about 50 angstroms.

42. The decoupling capacitor of claim 27 wherein the capacitor dielectric has a physical thickness of less than about 10 angstroms.

43. The decoupling capacitor of claim 27 wherein the capacitor has a width of larger than about 5 microns.

44. The decoupling capacitor of claim 27 wherein the capacitor has a width of larger than about 10 microns.

45. The decoupling capacitor of claim 27 wherein the capacitor has a length of larger than about 1 micron.

46. The decoupling capacitor of claim 27 wherein the capacitor has a length of larger than about 5 microns.

47. The decoupling capacitor of claim 27 wherein the first conductivity type is n-type and the second conductivity type is p-type.

48. The decoupling capacitor of claim 27 wherein the first conductivity type is p-type and the second conductivity type is n-type.

49. The decoupling capacitor of claim 27 further comprising spacers formed on sides of the top electrode.

50. The decoupling capacitor of claim 49 further comprising an etch-stop layer overlying the top electrode and the spacers.

51. The decoupling capacitor of claim 50 wherein the etch-stop layer comprises silicon nitride.

52. The decoupling capacitor of claim 50 further comprising an inter-layer dielectric overlying the etch-stop layer.

53. The decoupling capacitor of claim 52 wherein the inter-layer dielectric comprises silicon oxide.

54. The decoupling capacitor of claim 52 wherein the inter-layer dielectric comprises a dielectric with a relative permittivity less than about 3.5.

55. The decoupling capacitor of claim 52 wherein the inter-layer dielectric comprises a dielectric with a relative permittivity less than about 3.0.

56. The decoupling capacitor of claim 52 wherein the inter-layer dielectric is selected from the group consisting of benzocyclobutene (BCB), SILK, FLARE, methyl silsesquioxane (MSQ), hydrogen silsesquioxane (HSQ) and SiOF.

57. The decoupling capacitor of claim 52 further comprising a first contact plug in electrical contact with the bottom electrode and a second contact plug in electrical contact with the top electrode.

58. The decoupling capacitor of claim 27 further comprising a shallow trench isolation region adjacent to the bottom electrode.

59. The decoupling capacitor of claim 27 wherein semiconductor substrate comprises a semiconductor-on-insulator (SOI) substrate and wherein the silicon surface layer includes a plurality of islands, wherein the islands are Isolated from one another by mesa isolation.

60. A decoupling capacitor comprising:
a semiconductor substrate comprising a silicon surface layer;
a substantially flat bottom electrode formed in a portion of the semiconductor surface layer, wherein the bottom electrode is doped to a first conductivity type;
doped regions formed in the silicon surface layer, the doped regions doped with the first conductivity type;
a capacitor dielectric overlying the bottom electrode, the capacitor dielectric comprising a high permittivity dielectric with a relative permittivity greater than about 5;
a substantially flat top electrode overlying the capacitor dielectric; and
wherein the top electrode is electrically coupled to a first reference voltage line and the bottom electrode is electrically coupled to a second reference voltage line.

61. The decoupling capacitor of claim 60 wherein the top electrode is connected to a power supply line and the bottom electrode is connected to a ground line.

62. The decoupling capacitor of claim 60 wherein the top electrode is connected to a first power supply line and the bottom electrode is connected to a second power supply line.

63. The decoupling capacitor of claim 60 wherein the semiconductor substrate is a bulk silicon substrate.

64. The decoupling capacitor of claim 60 wherein the semiconductor substrate is a silicon-on-insulator substrate.

65. The decoupling capacitor of claim 60 wherein the top electrode comprises silicon.

66. The decoupling capacitor of claim 60 wherein the top electrode comprises a metal selected from the group consisting of molybdenum, tungsten, titanium, tantalum, platinum, and hafnium.

67. The decoupling capacitor of claim 60 wherein the top electrode comprises a metal nitride selected from the group consisting of molybdenum nitride, tungsten nitride, titanium nitride, tantalum nitride, or combinations thereof.

68. The decoupling capacitor of claim 60 wherein the top electrode comprises a metal silicide selected from the group consisting of nickel silicide, cobalt silicide, tungsten silicide, titanium silicide, tantalum silicide, platinum silicide, erbium silicide, or combinations thereof.

69. The decoupling capacitor of claim 60 wherein the high permittivity dielectric comprises hafnium oxide.

70. The decoupling capacitor of claim 60 wherein the high permittivity dielectric comprises a material selected from the group consisting of hafnium oxynitride, hafnium silicate, zirconium oxide, zirconium oxynitride, zirconium silicate, and combinations thereof.

71. The decoupling capacitor of claim 60 wherein the high permittivity dielectric has relative permittivity of greater than 10.

72. The decoupling capacitor of claim 60 wherein the high permittivity dielectric has a relative permittivity of greater than 20.

73. The decoupling capacitor of claim 60 wherein the capacitor dielectric has a physical thickness of less than about 100 angstroms.

74. The decoupling capacitor of claim 60 wherein the capacitor dielectric has a physical thickness of less than about 50 angstroms.

75. The decoupling capacitor of claim 60 wherein the capacitor dielectric has a physical thickness of less than about 10 angstroms.

76. The decoupling capacitor of claim 60 wherein the capacitor has a width of larger than about 5 microns.

77. The decoupling capacitor of claim 60 wherein the capacitor has a width of larger than about 10 microns.

78. The decoupling capacitor of claim 60 wherein the capacitor has a length of larger than about 1 micron.

79. The decoupling capacitor of claim 60 wherein the capacitor has a length of larger than about 5 microns.

80. The decoupling capacitor of claim 60 further comprising spacers formed on sides of the top electrode.

81. The decoupling capacitor of claim 80 further comprising an etch-stop layer overlying the top electrode and the spacers.

82. The decoupling capacitor of claim 81 wherein the etch-stop layer comprises silicon nitride.

83. The decoupling capacitor of claim 81 further comprising an inter-layer dielectric overlying the etch-stop layer.

84. The decoupling capacitor of claim 83 wherein the inter-layer dielectric comprises silicon oxide.

85. The decoupling capacitor of claim 83 wherein the inter-layer dielectric comprises a dielectric with a relative permittivity less than about 3.5.

86. The decoupling capacitor of claim 83 wherein the inter-layer dielectric comprises a dielectric with a relative permittivity less than about 3.0.

87. The decoupling capacitor of claim 83 wherein the inter-layer dielectric is selected from the group consisting of benzocyclobutene (BCB), SILK, FLARE, methyl silsesquioxane (MSQ), hydrogen silsesquioxane (HSQ), and SiOF.

88. The decoupling capacitor of claim 83 further comprising a first contact plug in electrical contact with the bottom electrode and a second contact plug in electrical contact with the top electrode.

89. The decoupling capacitor of claim 60 further comprising a shallow trench isolation region adjacent to the bottom electrode.

90. The decoupling capacitor of claim 60 wherein semiconductor substrate comprises a semiconductor-on-insulator (SOI) substrate and wherein the silicon surface layer includes a plurality of islands, wherein the islands are isolated from one another by mesa isolation.

* * * * *

UNITED STATES PATENT AND TRADEMARK OFFICE
CERTIFICATE OF CORRECTION

PATENT NO. : 6,936,881 B2
DATED : August 30, 2005
INVENTOR(S) : Yeo et al.

It is certified that error appears in the above-identified patent and that said Letters Patent is hereby corrected as shown below:

Column 10,
Line 12, delete "dietetic" insert -- dielectric --.

Signed and Sealed this

Eighth Day of November, 2005

JON W. DUDAS
*Director of the United States Patent and Trademark Office*